United States Patent [19]

Cooney

[11] 4,397,519

[45] Aug. 9, 1983

[54] ELECTRICAL CONTACT CONSTRUCTION

[75] Inventor: James S. Cooney, Attleboro, Mass.

[73] Assignee: Pylon Company, Inc., Attleboro, Mass.

[21] Appl. No.: 262,842

[22] Filed: May 12, 1981

[51] Int. Cl.³ .................................. H01R 11/22
[52] U.S. Cl. ........................ 339/255 R; 324/158 P; 339/108 TP
[58] Field of Search ......... 339/108 TP, 149 P, 150 B, 339/151 B, 255 R; 324/158 P

[56] References Cited

U.S. PATENT DOCUMENTS 3,435,168  3/1969  Cooney .................. 339/108 TP
4,289,367  9/1981  Everett .................. 339/255 R Primary Examiner—John McQuade
Assistant Examiner—Paula Austin
Attorney, Agent, or Firm—Salter & Michaelson

[57] ABSTRACT

An electrical contact construction is disclosed of the type that is provided with a spring-loaded contact plunger and includes an elongated tubular body portion in which the plunger is received, retaining means as defined by spaced elongated projections being formed in the wall of the tubular body portion for restricting outward movement of the plunger.

5 Claims, 4 Drawing Figures

ELECTRICAL CONTACT CONSTRUCTION

BACKGROUND OF THE INVENTION

The electrical contact construction as embodied in the subject invention is of the type as illustrated and described in applicant's prior issued U.S. Pat. No. 3,435,168.

In the aforesaid U.S. Pat. No. 3,435,168, an electrical contact is disclosed that is of the plunger-type and that is generally for use in testing of printed circuit boards on test fixtures. Although not disclosed in the prior mentioned patent, the spring-loaded test probes as shown and described in the patent are mounted in a test fixture and a plurality of corresponding contacts are located in an array on a printed circuit board under test. When the board is placed in the test fixture, electrical contact is made between the contacts which define the test probes and the circuit of the printed circuit board for purposes of carrying out the testing procedure.

As shown in U.S. Pat. No. 3,435,168, the electrical contact illustrated and described therein generally includes an elongated tubular member in which a plunger is located, the plunger being disposed outwardly in a biased position by a contact spring. A ball member is also located within the tubular member and cooperates with the spring to normally urge the plunger outwardly of the tubular member. In order to prevent the plunger from being expelled from the tubular member under pressure of the spring, a plurality of indentations or dimples are formed in the tubular member and are engageable by an enlarged portion of the plunger. Although the dimples were not disclosed in the prior known construction as having sharp inner corners, the dimples were formed such that the inwardly directed projections produced by the dimples were generally semi-spherical and only point contact was made by engagement of the plunger portion therewith. This sometimes resulted in the plunger member riding over the dimples and becoming lodged or wedged therebetween and the wall of the tubular member, thereby preventing the contact from operating effectively during tests. Even the bevel as formed on the end of the plunger member was not always effective in preventing the plunger from becoming snared or wedged on one of the dimple projections as formed in the wall of the tubular member.

In some instances and in particular when the diameter of the tubular member was relatively large, an annular ring was formed in the tubular member for defining the plunger stop. Such a ring defined a continuous shoulder which was effective for receiving the plunger portion thereagainst. However, the formation of the annular ring sometimes weakened the wall of the tubular members which on occasion caused the tubular member to snap apart during use.

It is the purpose of the subject invention to avoid the attendent difficulties as experienced in the so-called retaining means of the electrical contact as disclosed in the aforesaid U.S. Pat. No. 3,435,168 and as further discussed above and to provide an effective but inexpensive stop for the contact plunger.

SUMMARY OF THE INVENTION

The electrical contact construction as embodied in the subject invention comprises an elongated tubular body portion that is formed of a metal material and that is open at one end for receiving a metallic plunger in sliding relation therein. The metallic plunger has an enlarged portion formed on the inner end thereof, a contact portion being formed on the exterior end of the plunger for engagement with an exteriorly located contact. A spring is located in the bore of the body portion and is operative to normally urge the plunger in an outwardly direction so that the contact portion is exposed for engagement with a corresponding contact when the device is used for test purposes. In order to prevent the plunger from being "hung-up" within the plunger body and thereby hindering the test procedure in which the contact is utilized, retaining means are formed in the body portion for engagement with the contact plunger, thereby preventing the plunger from sliding outwardly of the body portion. The retaining means include a plurality of spaced inwardly directed projections, the longitudinal dimension of which is greater than the lateral dimension thereof.

By forming the projections such that they are longer than they are wide, an effective area of contact for the interior plunger is provided, yet the elongated projections prevent the plunger edges from becoming jammed thereagainst, and thereby effectively retain the plunger within the tubular body portion as required.

Accordingly, it is an object of the present invention to provide an electrical contact construction having a tubular body portion in which a contact plunger is located, retaining means being formed in the tubular body portion and being shaped such that the longitudinal dimension thereof is greater than the lateral dimension thereof, wherein the plunger is prevented from being wedged within the tubular body portion during use of the contact consturction.

Other objects, features and advantages of the invention shall become apparent as the description thereof proceeds when considered in connection with the accompanying illustrative drawing.

DESCRIPTION OF THE DRAWING

In the drawing which illustrates the best mode presently contemplated for carrying out the present invention.

DESCRIPTION OF THE INVENTION

Figure 1:
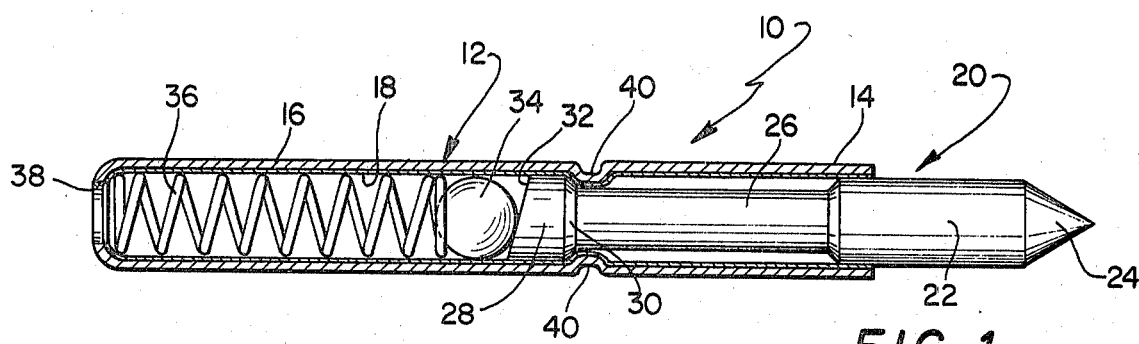
FIG. 1 is a sectional view of the electrical contact construction as embodied in the present invention.

Referring now to the drawing and particularly to FIG. 1, the electrical contact construction embodied in the present invention is illustrated and is generally indicated at 10. The contact construction 10 includes an elongated tubular body portion generally indicated at 12, the body portion 12 being formed with a forward section 14 and a rearward section 16 integrally joined to the forward portion. The body portion 12 is preferably made of a base metal such as brass, nickel, steel or stainless steel and has a relatively thin wall. Located interiorly of the tubular body portion 12 and extending the length thereof throughout the sections 14 and 16 is an inner layer 18 that is preferably formed of a precious metal such as is normally utilized in electrical connections. In this connection, the layer 18 may be selected from a group of materials comprising gold, gold alloys, silver or silver alloys, or platinum and the platinum family metals and alloys. The function of the inner layer 18 is to insure the proper electrical contact be made in use of the device as will be described hereinafter. The liner 18 is preferably brazed to the interior wall of the tubular body portion 12, or if desired it may be solid-phase bonded thereto.

Extending interiorly of the tubular body portion 12 and primarily occupying the forward section 14 is a plunger generally indicated at 20. The plunger 20 is defined by a forward enlarged cylindrical end portion 22, the pointed end 24 normally being exposed for engagement with a corresponding contact or terminal in use of the device. Connected to the enlarged forward plunger portion 22 is an intermediate shank portion 26 to which an enlarged rear plunger portion 28 is joined, the plunger portion 28 being located in the forwardmost end of the rear section 16 of the tubular body portion. The plunger portion 28 is formed with a beveled end 30 that is joined directly to the shank portion 28, the opposite end of the rear plunger portion 28 being slanted to define an inclined surface 32.

In order to force the plunger 20 to its outward position and to further provide effective electrical contact between the plunger and the interior lining 18, a ball 34 is provided and is engageably interposed between the inclined surface 32 of the plunger portion 28 and a spring 36, the other end of the spring 36 being seated against an inturned edge 38 of the rear section 16 of the tubular body portion. It is seen that the diameter of the ball 34 is slightly less than the diameter of the section 16 and the lining 18 which permits the ball to having rolling movement within the confines of the rear section 16 and the lining 18. The spring 36 thus urges the ball 34 against the inclined surface 32 of the rear plunger portion 28, the forwardly directed force of the ball against the inclined surface 32 producing a laterally extending component of force on the rear plunger portion 28 that forces the rear plunger portion 28 into intimate contact with the inner liner 18 for establishing positive electrical engagement therewith.

Figure 2:
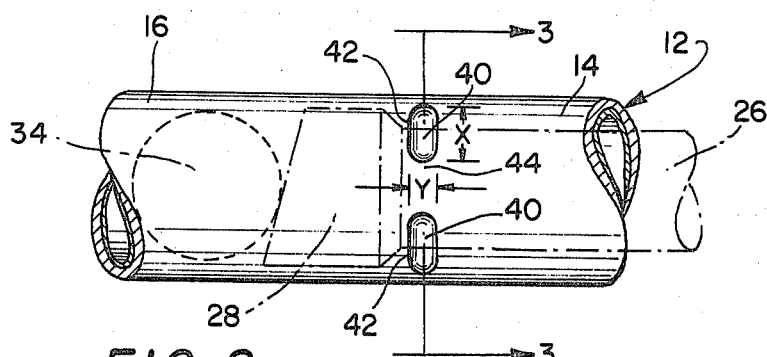
FIG. 2 is an enlarged fragmentary elevational view of a portion of the electrical contact construction showing the retaining means as formed therein.
Figure 3:
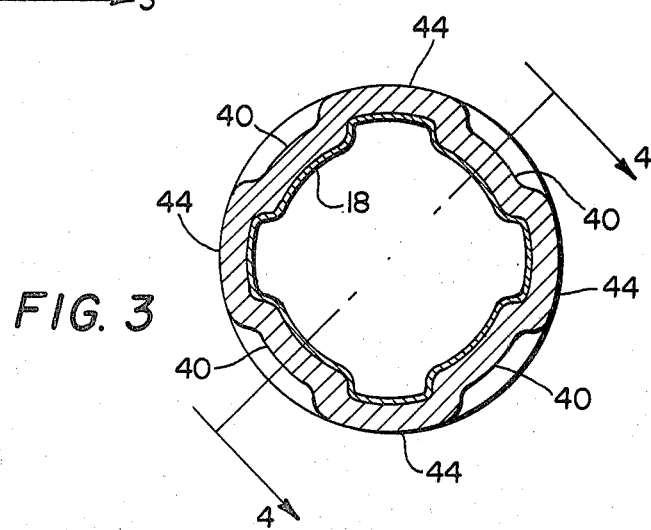
FIG. 3 is a sectional view taken along line 3—3 in FIG. 2.
Figure 4:
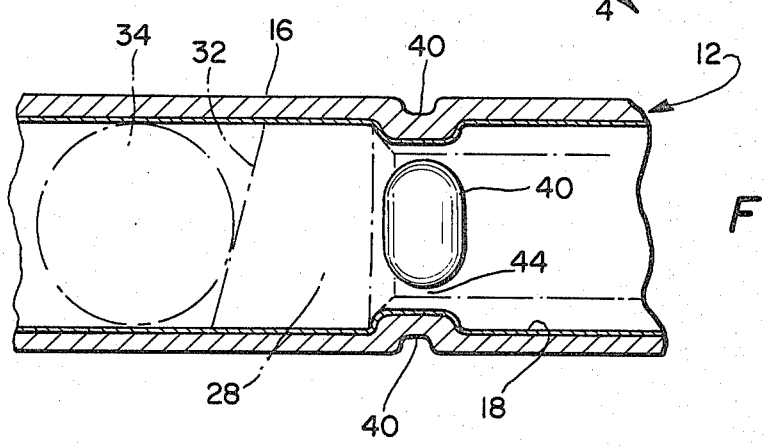
FIG. 4 is a sectional view taken along line 4—4 in FIG. 3.

In order that the plunger 20 be maintained in the forwardmost position thereof as illustrated in FIG. 1, the wall of the tubular body portion 12 is formed with a plurality of inwardly directed projections indicated at 40, the projections 40 being more clearly shown in FIGS. 2-4. In applicant's prior U.S. Pat. No. 3,435,168, an indentation in the wall of the contact was also utilized in the form of a dimple or dimples that engaged the rear plunger portion to prevent the forward movement of the plunger. However, under operating conditions of the contact as illustrated in U.S. Pat. No. 3,435,168 the dimples were not always effective in retaining the rear plunger portion thereagainst and on occasion the rear plunger portion become wedged between the dimples and the interior wall of the tubular body portion and thus hindered the test procedure in which the contact was utilized. Further, the dimples sometime became worn or flattened and in such instances, the plunger could "ride over" over the dimples and fly out of the tubular member. On occasion the plunger could stick in the down position when the outer enlarged portion wedged in the dimples. In this event the contact was ineffective in operation. In order to overcome the problems that were experienced in the electrical contact as illustrated in U.S. Pat. No. 3,435,168 the present construction provides that the projections 40 be formed in a configuration that in effect defines an interrupted annular ring.

Referring more particularly to FIG. 2, two of the projections 40 are shown as formed in the wall of the tubular body portion 12, and as illustrated, the projections 40 have a longitudinal dimension "x" and a lateral dimension "y". The longitudinally extending edges of the projections 40 are relatively straight and thereby provide a rear contact edge 42 for engagement by the bevelled section 30 of the rear portion 28 of the plunger 20. Since the contact edges 42 of the projections 40 are necessarily elongated to define the interrupted annular ring, the dimension "x" therefore is formed at least two times greater than the lateral dimension "y" thereof, although the dimension "x" is preferably formed at least 2.5 times the dimension "y".

It is seen that the contact edges 42 of the projections 40 define an interrupted edge with a space or intermediate portion 44 therebetween which avoids the weakening of the thin wall of the tubular body portion 12. The intermediate portions 44 as formed between the projections 40 can include as much as 50 percent of the total circumferential area that is defined by the projections 40 thereby insuring that sufficient contact with the edges 42 will be available for engagement with the bevelled portion 30 of the rear plunger portion 28 without weakening the wall of the tubular body portion 12. It is seen that the edges 42 of the inwardly directed projections 40 as engaged by the bevelled section 30 of the rear portion 28 are effective to prevent forward movement of the plunger 20 beyond the position as illustrated in FIG. 1. Thus, by forming the elongated projections 40 in the manner as illustrated and described, the bevelled portion 30 of the rear plunger portion 28 cannot move therebeyond or become wedged thereagainst, since sufficient edge contact is maintained between the edges 42 of the inwardly directed projections and the bevelled edge 30. It is further seen that the interrupted ring as defined by the edges 42 not only prevents wedging of the rear plunger portion 28; but since a sufficient part of the tubular body portion is not indented, the wall thereof is not weakened as would occurr in the formation of an annular scoring or indentation.

In use of the device, the plunger 20 normally extends outwardly of the forward section 14 as illustrated in FIG. 1 and the contact construction 10 is normally formed as part of the plurality of such contacts as mounted on a suitable test block. When the contact constructions as so mounted are pressed against a punch card or the like such as used in a program controller card, the plungers penetrate the card and are brought into electrical engagement with suitably positioned and oriented contacts on a base plate on which the card is mounted. A preprogrammed test procedure is then followed. It is seen that the plunger 20 of the contact construction as embodied herein effectively is maintained in the outer position by the spring 36 that urges the ball 34 into contact with the inclined surface 32 of the rear plunger portion 28 and appropriate electrical contact is thus maintained through the contact construction by means of the plunger 20 and the interior liner 18. Even though the spring 36 may be periodically compressed during use of the device, release of the pressure on the plunger 20 and the return of this spring to its normal position will always result in the plunger 20 being retained in the outermost position, since the projections 40 will positively receive the bevelled edge 32 of the rear plunger portion thereagainst without wedging thereover. Further, the projections 40 will prevent any possibility of the plunger 20 being wedged in the innermost position thereof.

While there is shown and described herein certain specific structure embodying this invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. An electrical contact construction, comprising an elongated tubular body portion formed of a metal material and being open at least at one end to expose the interior bore thereof, a metallic plunger extending into said bore in sliding relation therein and having an enlarged inner plunger portion joined to the inner end thereof, an outer contact plunger portion formed on the exterior end of said plunger for engagement with an exteriorly located contact, a spring located in said bore and being operative to normally urge said plunger in an outwardly direction for exposing said outer contact plunger portion, and retaining means formed in said body portion and being engageable with said plunger for preventing said plunger from sliding outwardly of said body portion, said retaining means including a plurality of spaced inwardly directed projections which define an interrupted annular ring substantially perpendicular to the longitudinal axis of said body portion, the longitudinal dimension of each of said projections extending in the direction of the ring and being greater than the lateral dimension thereof.

2. An electrical contact construction as claimed in claim 1, the longitudinal dimension of said inwardly directed projections being more than twice the lateral dimension thereof.

3. An electrical contact construction as claimed in claim 1, at least four of said projections being formed in said body portion.

4. An electrical contact construction as claimed in claim 3, said projections being spaced equidistant apart around the periphery of said tubular body portion.

5. An electrical contact construction as claimed in claim 4, the centermost point of each projection being spaced 90° apart in radial relation with respect to the centermost point of the adjacent projections.

* * * * *